US007236113B1

(12) United States Patent
Wang

(10) Patent No.: US 7,236,113 B1
(45) Date of Patent: Jun. 26, 2007

(54) CAPACITANCE-TO-DIGITAL MODULATOR WITH SENSOR FAILURE-MODE DETECTION

(75) Inventor: Rongtai Wang, Eden Prairie, MN (US)

(73) Assignee: Emerson Process Management, Eden Prarie, MN (US)

( * ) Notice: Subject to any disclaimer, the term of this patent is extended or adjusted under 35 U.S.C. 154(b) by 0 days.

(21) Appl. No.: 11/340,363

(22) Filed: Jan. 26, 2006

(51) Int. Cl.
*H03M 3/00* (2006.01)

(52) U.S. Cl. .................. 341/143; 341/150; 324/548; 324/658; 324/678; 324/679

(58) Field of Classification Search .............. None
See application file for complete search history.

(56) References Cited

U.S. PATENT DOCUMENTS

| 5,057,839 | A | * | 10/1991 | Koch ........................ 341/143 |
| 5,083,091 | A | | 1/1992 | Frick et al. |
| 5,159,341 | A | * | 10/1992 | McCartney et al. ........ 341/143 |
| 5,323,158 | A | * | 6/1994 | Ferguson, Jr. .............. 341/143 |
| 5,637,802 | A | | 6/1997 | Frick et al. |
| 5,974,895 | A | * | 11/1999 | Steger et al. ................ 73/769 |
| 6,089,097 | A | | 7/2000 | Frick et al. |
| 6,140,952 | A | * | 10/2000 | Gaboury ..................... 341/143 |
| 6,295,875 | B1 | | 10/2001 | Frick et al. |
| 6,356,085 | B1 | * | 3/2002 | Ryat et al. .................. 324/658 |
| 6,509,746 | B1 | | 1/2003 | Wang |
| 6,516,672 | B2 | | 2/2003 | Wang |
| 6,720,777 | B2 | | 4/2004 | Wang |
| 6,744,258 | B2 | * | 6/2004 | Ishio et al. ................. 324/548 |
| 6,834,258 | B2 | * | 12/2004 | Schulte et al. ............. 702/183 |
| 6,970,126 | B1 | * | 11/2005 | O'Dowd et al. ............ 341/172 |
| 2006/0213270 | A1 | * | 9/2006 | O'Dowd et al. ............ 73/514.32 |

* cited by examiner

*Primary Examiner*—Khai M. Nguyen
(74) *Attorney, Agent, or Firm*—Kinney & Lange, P.A.

(57) ABSTRACT

A pressure transmitter having a capacitance-to-digital modulator produces an output as a function of sensor capacitance and a reference capacitance. Transmitter also includes a sensor failure mode detector produces an output signal and identifies failure modes of the sensor capacitance and reference capacitance.

31 Claims, 8 Drawing Sheets

CAPACITANCE-TO-DIGITAL MODULATOR WITH SENSOR FAILURE-MODE DETECTION

BACKGROUND OF THE INVENTION

The present invention relates to a measurement system. In particular, the present invention relates to a capacitance-to-digital modulator for use with a capacitive pressure sensor.

A field transmitter is a device that is used to monitor the operation of an industrial process. The field transmitter includes a transducer that responds to a measured process variable with a sensing element and converts the variable to a standardized transmission signal that is a function of the measured variable. The term "process variable" refers to a physical or chemical state of matter or conversion of energy. Examples of process variables include pressure, temperature, flow, conductivity, and pH.

One such transmitter is described in U.S. Pat. No. 6,295,875 by Roger L. Frick and David A. Broden. This transmitter employs a capacitive sensor having a deflectable sensing diaphragm and three or more capacitor electrodes which form separate capacitive sensing elements with the diaphragm. Two of the capacitor elements are primary sensing capacitors that are arranged differentially so that the capacitances of the primary sensing capacitors charge oppositely in proportion to the process variable. The third and fourth capacitor elements are compensation capacitors that provide signals representing offset errors or hysteresis associated with the primary capacitors. As pressure is applied to one or both sides of the diaphragm, the diaphragm deflects. The deflection of the diaphragm can be detected by measuring a change in a ratio of electrical capacitance related to the deflection. This capacitance ratio is converted into a digital format using an analog-to-digital converter.

Another type of transmitter is described in U.S. Pat. Nos. 5,637,802 and 6,089,097 by Roger L. Frick, Bennett L. Louwagie and Adrian C. Toy. The transmitter described in these two patents uses two absolute pressure sensors to measure differential pressure as well as two absolute pressures, with high resolution on the differential pressure measurement.

One particularly advantageous form of analog-to-digital converter uses a sigma-delta (or delta-sigma) modulator. The use of sigma-delta modulators in transmitters is described in U.S. Pat. No. 5,083,091 by Roger L. Frick and John P. Schulte; U.S. Pat. No. 6,140,952 by Michael Gaboury; U.S. Pat. No. 6,509,746 by Rongtai Wang; and U.S. Pat. No. 6,516,672 by Rongtai Wang.

In a transmitter having a sigma-delta modulator acting as a capacitance-to-digital (CD) converter, an excitation circuit provides charge packets to the capacitive sensor elements. The sensor elements are charged by an amount based on the capacitance value of that capacitive element. The charges are transferred to an integrator/amplifier of the sigma-delta modulator to produce a one-bit binary output which is a function of a capacitance ratio.

The basic function of the CD modulator is to convert the capacitance ratio into a PCM (pulse code modulation) signal. For a CD modulator using sigma-delta architecture, the actual process involves converting a charge ratio into a PCM signal. Under normal operating conditions, since the charge is proportional to the capacitance, the charge ratio is equal to the capacitance ratio.

However, this equivalent relation is not true under certain abnormal operating conditions. Sensor failure mode conditions can occur in which the sensor is either disconnected from the CD converter or has failed due to a loss of physical integrity. The CD modulator may continue operating as usual without providing warning signals, even though the pressure readings no longer represent the true pressure under measurement.

BRIEF SUMMARY OF THE INVENTION

A pressure transmitter including a sensor capacitance, a reference capacitance, and a primary capacitance to digital (CD) modulator provides sensor failure mode detection to identify when the sensor capacitance or the reference capacitance is in a failure mode. A secondary sensor failure mode modulator operates while the reference capacitance is active to produce a pulse-code modulated signal that is a function of the reference capacitance. Based upon outputs of the primary and secondary modulators, sensor failure mode conditions can be identified.

A BRIEF DESCRIPTION OF THE DRAWINGS

DETAILED DESCRIPTION

Figure 1:
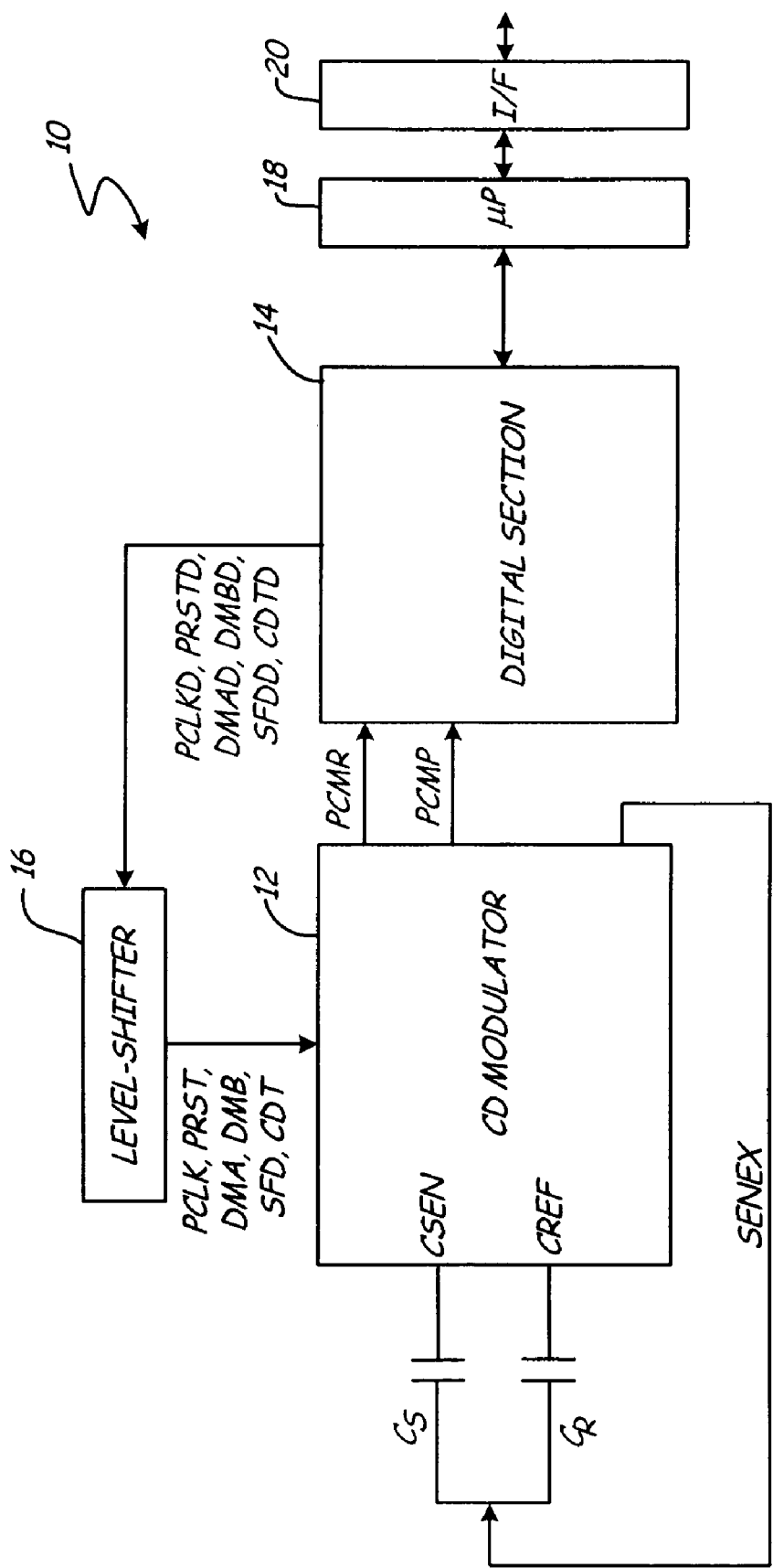
FIG. 1 is a block diagram of a pressure transmitter including a sensor capacitor, a reference capacitor, and a capacitance-to-digital (CD) modulator.

FIG. 1 shows pressure transmitter 10, which is a capacitance-based pressure transmitter that includes sensor capacitor $C_S$ and reference capacitor $C_R$, CD modulator 12, digital section 14, level shifter 16, microprocessor 18, and interface 20. Pressure transmitter 10 produces an output signal that is a function of pressure sensed by sensor capacitor $C_S$.

CD modulator 12 is a second order sigma-delta converter. The main function of CD modulator 12 is to convert the capacitance ratio $C_R/(C_S+C_R)$ into a pulse code modulation signal PCMP. Output signal SENEX is an excitation signal generated by CD modulator 12. The SENEX signal is connected to the common plate of sensor capacitor $C_S$ and reference capacitor $C_R$. The other plates of capacitors $C_S$ and $C_R$ are connected to input nodes CSEM and CREF, respectively, of CD modulator 12. CD modulator 12 also includes a sensor failure-mode detector to indicate when sensor capacitor $C_S$ is in a failure operation mode. When the sensor failure mode detector is active, CD modulator 12 produces a pulse code modulation signal PCMR that can be used to identify whether sensor $C_S$ is operating in a normal or a failure mode.

Digital section 14 includes a SINC filter that further converts the pulse code modulation signals PCMP and PCMR to higher resolution readings. Digital section 14 also stores readings, and provides control and timing signals that control the operation of CD modulator 12. The control and timing signals produced by digital section 14 include clock signal PCLKD, reset signal PRSTD, modulator operation control signals DMAD and DMBD, sensor failure mode detection function enable signal SFDD, and modulator test enable signal CTDD.

Level shifter 16 provides an interface between digital section 14 and the analog circuitry of CD modulator 12. Level shifter 16 converts the timing and control signals from digital section 14 to the PCLK, PRST, DMA, DMD, SFD, and CTD input signals used by CD modulator 12.

Microprocessor 18 receives digital data from digital section 14, and provides operational instructions and parameters to digital section 14. Communication between transmitter 10 and a control room is provided by microprocessor 18 through interface 20. The communication may be through a two wire loop or network over which analog, digital, or a combination of analog and digital signals are transmitted, or may be via wireless transmission.

Figure 2:
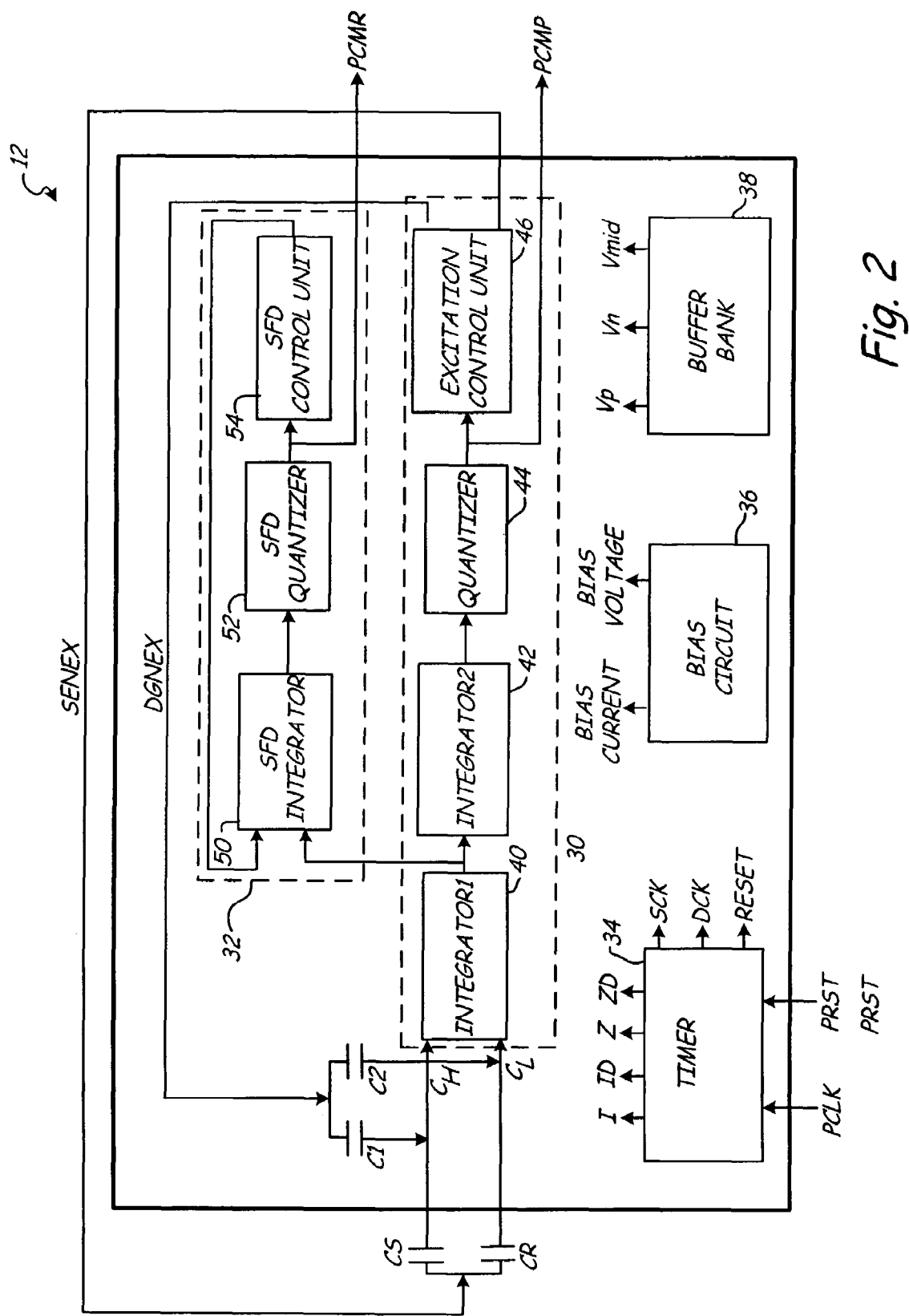
FIG. 2 is a block diagram of the CD modulator of the transmitter of FIG. 1.

FIG. 2 is a block diagram of CD modulator 12, which includes second order sigma-delta modulator 30, sensor failure mode detector 32, timing circuit 34, bias circuit 36, buffer bank 38, and diagnostic capacitances C1 and C2. Sigma-delta modulator 30 includes first stage integrator 40, second stage integrator 42, quantizer 44, and excitation control unit 46. Sensor failure mode detector 32 is a first order sigma-delta modulator, and includes SFD integrator 50, SFD quantizer 52, and SFD control unit 54.

Second order sigma-delta modulator 30 produces the PCMP output as a function of effective input capacitances $C_H$ and $C_L$ connected to the inputs of first stage integrator 40. The general transfer function of modulator 30 is $D_P = C_L/(C_H + C_L)$, where $D_P$ is the pulse density of the PCMP signal.

First stage integrator 40 is a sigma-delta integrator that produces a first stage output $V_{OUT1}$ that is a function of capacitances $C_H$ and $C_L$. Second stage integrator 42 is a sigma-delta integrator that samples the $V_{OUT1}$ output of first stage integrator, and produces an output $V_{OUT2}$ that is supplied to quantizer 44.

The function of quantizer 44 is to convert the $V_{OUT2}$ output signal of second stage integrator 42 to pulse code modulation signal PCMP, which is delivered to digital section 14. The output of quantizer 44 also is used by excitation control unit 46 to generate the SENEX and DGNEX excitation signals.

CD modulator 12 has two main operating modes (normal mode and built-in-test mode), which are selected by logic control signals DMA and DMB from digital section 14 and level shifter 16. The SENEX excitation signal is delivered to capacitors $C_S$ and $C_R$ during the normal mode of modulator 30. The DGNEX signal is supplied to on-chip capacitances C1 and C2 during a built in test (BIT) mode.

Modulator 12 is in the normal mode if DMA=DMB=0. Modulator 12 is in BIT mode if DMA=1 or DMB=1. When CD modulator is in normal mode, external sensor capacitor $C_S$ and reference capacitor $C_R$ are connected to modulator 30 as $C_H$ and $C_L$, respectively. When CD modulator 12 is in the built-in-test (BIT) mode, selectable on-chip capacitances C1 and C2 are connected to modulator 30 as $C_H$ and $C_L$, respectively.

TABLE 1

| DMA | DMB | Operation Mode | $C_H$ | $C_L$ |
|---|---|---|---|---|
| 0 | 0 | Normal Mode | $C_S$ | $C_R$ |
| 1 | 0 | BIT-Mode A | $C_1 = 40$ pF | $C_2 = 20$ pF |
| 0 | 1 | BIT-mode B | $C_1 = 20$ pF | $C_2 = 40$ pF |
| 1 | 1 | BIT-mode C | $C_1 = 20$ pF | $C_2 = 20$ pF |

For normal mode, $D_P = \dfrac{C_R}{C_R + C_S}$

For BIT-mode A, $D_P = \frac{1}{3}$
For BIT-mode B, $D_P = \frac{2}{3}$

The BIT mode allows transmitter 10 to verify whether signal processing circuitry of CD modulator 12 and digital section 14 are functioning properly. This is achieved by connecting known capacitances to the inputs of first stage integrator 40 and checking whether the expected pulse density of the PCMP signal is achieved.

The BIT mode, however, does not determine whether sensor capacitor $C_S$ is operating properly, or is in a failure mode. CD modulator 12 includes sensor failure mode detector 32, which provides the PCMR signal to identify when the sensor is in a failure mode. For example, a sapphire capacitive pressure sensor has two failure operation modes to be considered: an open sensor mode (OS-mode) and an oil filled mode (OF-mode).

The OS-mode may occur as a result of high pressure (larger than 10 kpsia). Due to the propagation of cracks in the sapphire material caused by the high pressure, the leads of sensor capacitor $C_S$ may be disconnected from sensor excitation signal SENEX. In the OS-mode, the effective input capacitance $C_H$ to first stage integrator 40 is reduced to below normal range.

The OF-mode occurs when the fusion bond of the sapphire stack forming sensor capacitor $C_S$ is in failure status. As a result, the pressure fill media may enter the inside of the sapphire stack. Since the dielectric constant of the pressure fill media is much larger than that of a vacuum, the input capacitance $C_H$ in OF-mode can become much larger than during normal operation.

In order to determine if the sensor $C_S$ is operating in a failure mode, SFD detector 32 must be able to monitor the capacitance of reference capacitor $C_R$ and sensor capacitor $C_S$. An important restriction on the monitoring process is that the normal operation of CD modulator 12 should not be interrupted or disturbed.

SFD detector 32 is a secondary oversampling analog to digital converter. The basic function of SFD detector 32 is to convert the capacitance ratio $C_R/C_{F1}$ into the PCMR signal, where $C_R$ is the reference capacitor and $C_{F1}$ is the feedback capacitor of first stage integrator 40.

The capacitance ratio under the measurement of main CD modulator 30 is:

$$\eta_m = \frac{C_R}{C_R + C_S}$$

The capacitance ratio under the measurement of SFD detector 32 is:

$$\eta_R = \frac{C_R}{C_{F1}}$$

The capacitance ratio of the sensing capacitor versus the on-chip feedback capacitor $C_{F1}$ is:

$$\eta_S = \frac{C_S}{C_{F1}}$$

The ratio $\eta_S$ can be expressed in terms of the measured ratio $\eta_m$ and $\eta_R$ as:

$$\eta_S = \eta_R\left(\frac{1}{\eta_m} - 1\right)$$

Therefore, the measurement of capacitance ratio $\eta_S$ is not necessary in order to determine whether $C_S$ (or $C_R$) is in a failure mode. It can be calculated by microprocessor 18 based on the measured results of $\eta_m$ and $\eta_R$ by using the formula above.

As a numerical example, the capacitance of reference capacitor $C_R$ in the normal mode is about 15 pF; the capacitance of a sensor capacitor $C_S$ in the normal mode is somewhere between 15 pF to 30 pF depending on the pressure applied; and on-chip capacitor $C_F$ is 60 pF. When the sensor is operating in a failure mode, the effective capacitance values may deviate from their normal values dramatically.

If the ratio $\eta_R$ is equal to or less than $\frac{1}{30}$, then reference capacitor $C_R$ is in the OS-mode. If the ratio $\eta_R$ is equal to or larger than $\frac{1}{2}$, then reference capacitor $C_R$ is in the OF-mode. If the ratio $\eta_R$ is close to $\frac{1}{4}$, then reference capacitor $C_R$ is in the normal mode.

Similarly, if the ratio $\eta_S$ is equal to or less than $\frac{1}{30}$, sensing capacitor $C_S$ is in the OS-mode. If the ratio $\eta_S$ is equal to or larger than $\frac{5}{6}$, sensing capacitor $C_S$ is in the OF-mode. If the ratio $\eta_S$ is within the range of $\frac{1}{4} > \eta_s > \frac{3}{4}$, sensing capacitor $C_S$ is in the normal mode.

Figure 3:
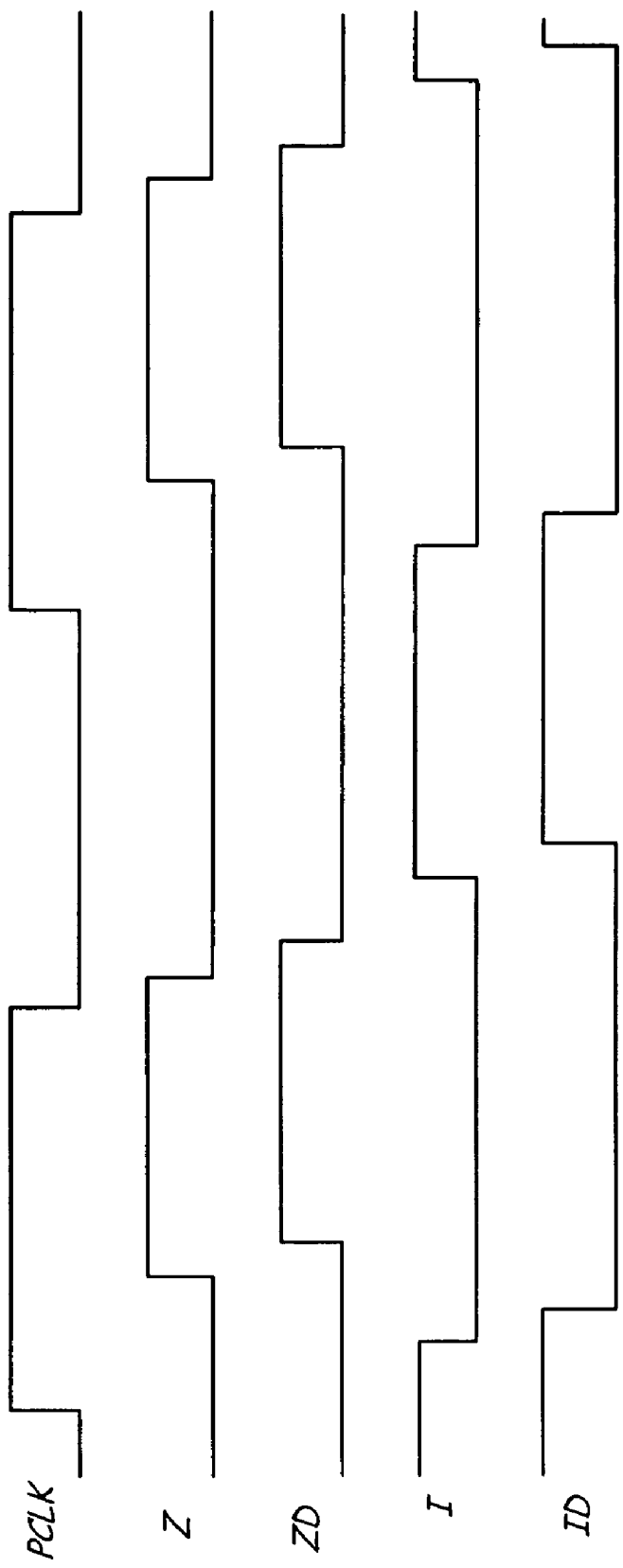
FIG. 3 shows waveforms of timing signals PCLK, Z, ZD, I, and ID for the CD modulator of FIG. 2.
Figure 8:
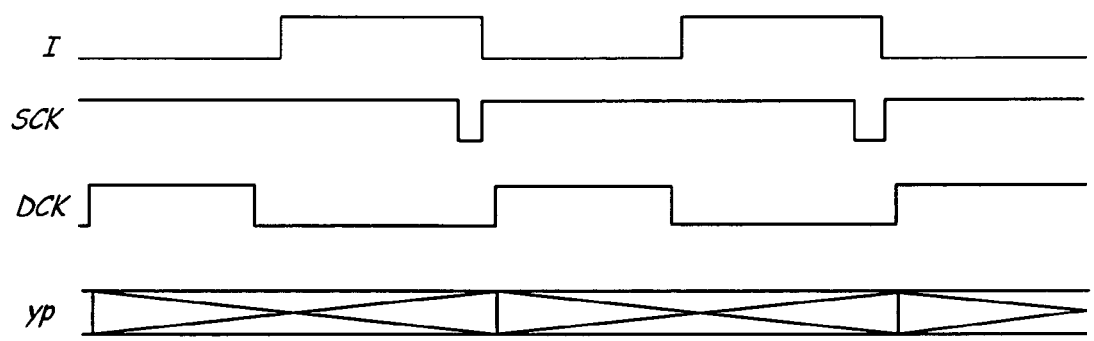
FIG. 8 shows waveforms of timing signals SCK and DCK.

Timer 34 provides timing signals used by both main modulator 30 and SFD modulator 32. The input and output signals of timer 34 are listed in Table 2. A non-overlapping two-phase clock generator is designed to generate signals Z and I, and their delay versions ZD and ID. The waveforms of signals PCLK, Z, ZD, I, ID are shown in FIG. 3. The timing relations of signal SCK and DCK are shown in FIG. 8. The CD modulator reset signal is RESET=PRST·Z.

TABLE 2

I/O signal list of the timing circuit

| Signal | Type | Descriptions |
| --- | --- | --- |
| PRST | Input | Reset Signal |
| PCLK | Input | Clock Signal |
| I | Output | Integration Phase |
| ID | Output | Delayed Integration Phase |
| Z | Output | Auto-zero Phase |
| ZD | Output | Delayed Auto-zero Phase |
| SCK | Output | Comparator Trigger Signal |
| DCK | Output | Quantizer Synchronize Signal |
| RESET | Output | CD Modulator Reset Signal |

Figure 4:
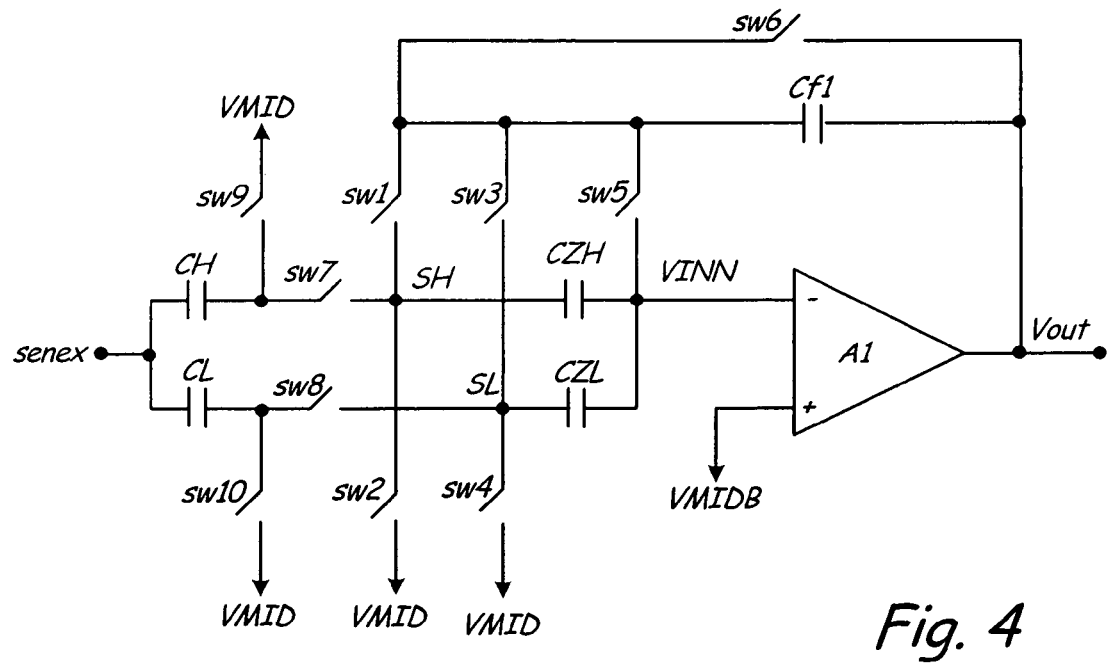
FIG. 4 is a schematic diagram of the first stage integrator of the CD modulator of FIG. 2.

FIG. 4 shows a simplified circuit schematic of integrator 40. It includes switches SW1–SW9, feedback capacitor $C_{F1}$, and two auto-zero capacitors $C_{ZH}$ and $C_{ZL}$. In one embodiment, $C_{F1}$=60 pF, $C_{ZH}$=$C_{ZL}$=15 pF. The incremental of first stage integrator 40 operation is specified as:

$$\Delta U(n) = \left(-\frac{C_H}{C_{F1}}\Delta Vex\right)\cdot Y_P(n) + \left(\frac{C_L}{C_{F1}}\Delta Vex\right)\cdot \overline{Y_P(n)}$$

where $Y_P(n)$ is the control signal generated by the quantizer, $C_{F1}$ is the feedback capacitor of the integrator, and $\Delta V_{ex}$ is the differential excitation voltage $(V_P - V_N)$.

The basic operations of first stage integrator 40 are as follows: Switches SW2 and SW5 provide the auto-zero path for $C_{ZH}$. Switches SW4 and SW5 provide the auto-zero path for $C_{ZL}$. Switches SW1 and SW7 provide the integration path for $C_H$. Switches SW3 and SW8 provide the integration path for $C_L$.

Figure 5:
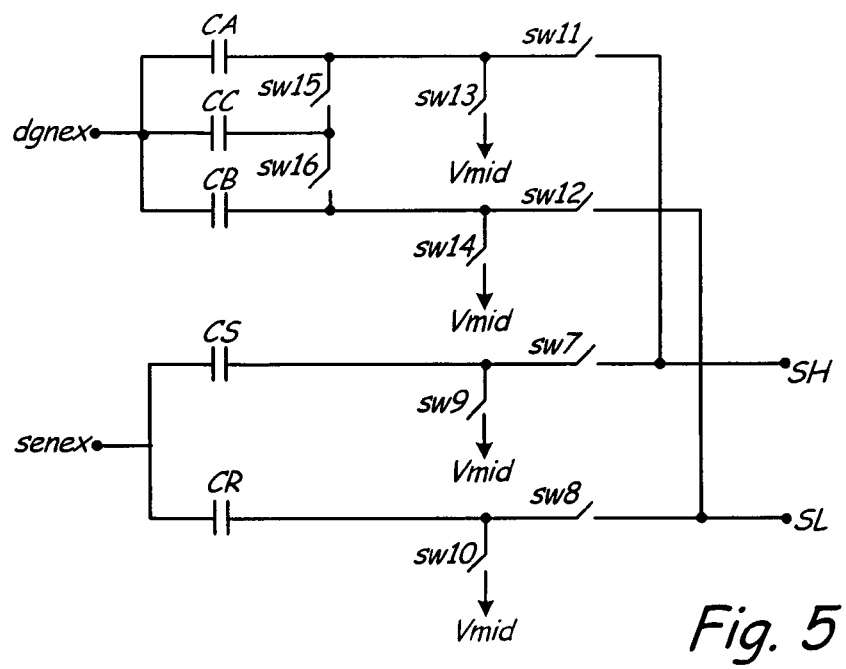
FIG. 5 is a schematic diagram of the capacitor input control circuit for the first stage integrator of FIG. 4.

The logic of the switch control signals are listed as follows:

$sw_1 = Y_P \cdot I$ $sw_2 = Y_P \cdot Z_D$ $sw_3 = \overline{Y_P} \cdot I$ $sw_4 = \overline{Y_P} \cdot Z_D$ $sw_5 = Z$ $sw_6 = $ RESET $sw_7 = sw_{10} = \overline{DMOD} \cdot Y_P$ $sw_8 = sw_9 = \overline{DMOD} \cdot \overline{Y_P}$ $DMOD = DMA + DMB$ FIG. 5 is a schematic diagram of the capacitor input control circuit for integrator 40, which includes switches SW7–SW14. On-chip capacitors $C_A$=$C_B$=$C_C$=20 pF, serve for built-in-test functions. The capacitor combination control signals are:

$sw_{15} = DMA \cdot \overline{DMB}$ $sw_{16} = \overline{DMA} \cdot DMB$

Figure 6:
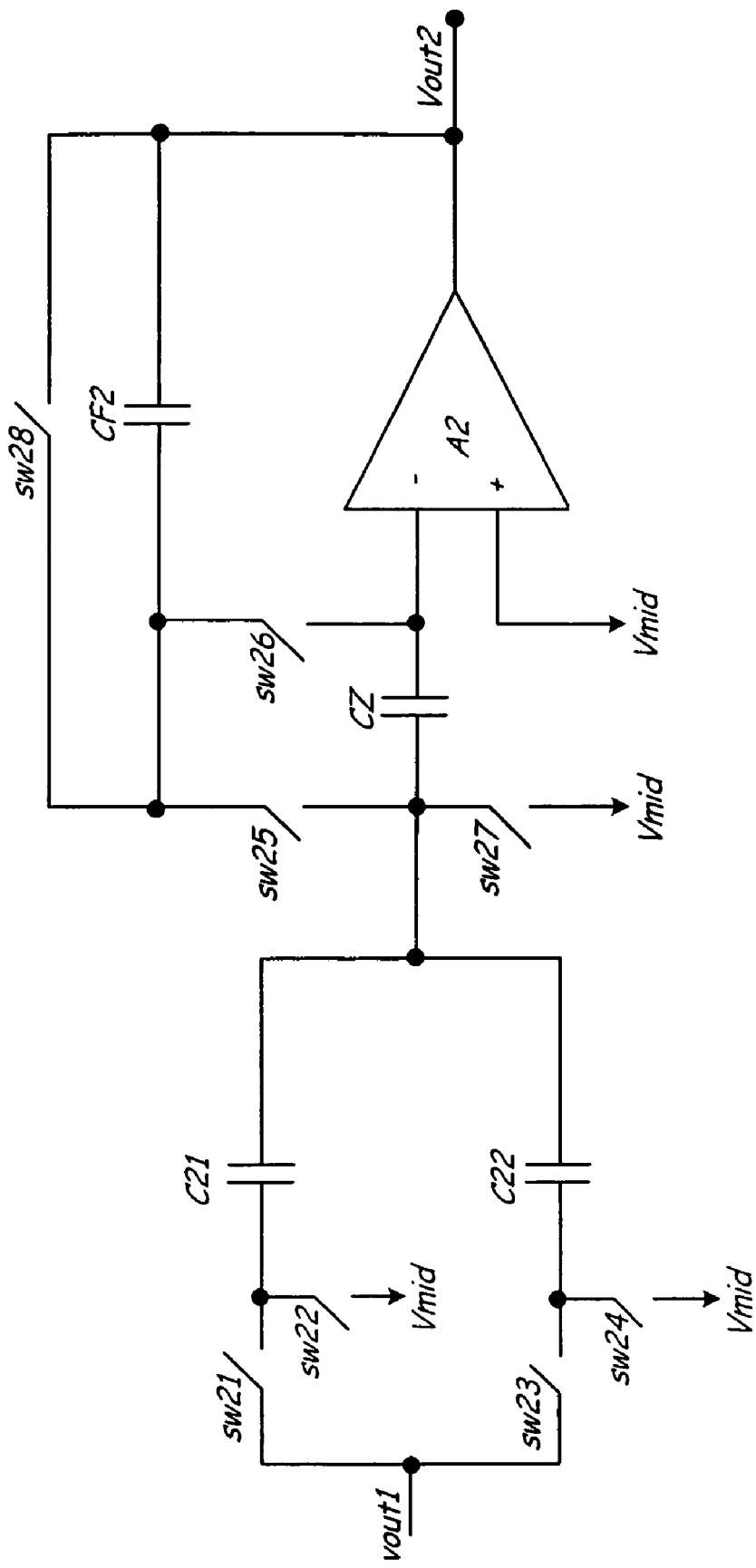
FIG. 6 is a schematic diagram of the second stage integrator of the CD modulator of FIG. 2.

The built-in-test capacitors input control signals are:

$sw_{11} = sw_{14} = DMOD \cdot Y_P$ $sw_{12} = sw_{13} = DMOD \cdot \overline{Y_P}$ FIG. 6 shows a simplified schematic of integrator 42. It includes amplifier A2, feedback capacitor $C_{F2}$=40 pF, auto-zero capacitor $C_Z$=10 pF, sampling capacitor $C_{21}$=20 pF and $C_{22}$=10 pF, and switches $SW_{21}$–$SW_{28}$. The incremental of second stage integrator 42 operation is specified as:

$\Delta W(n) = -\frac{1}{2}U(n) + \frac{1}{4}U(n-1)$ where $U(n)$ is the present integrator-1 output, and $U(n-1)$ is the previous integrator-1 output. The switch control signals for integrator 42 are as follows:

The input switched-capacitor sampling control signals are designed:

$sw_{21} = sw_{24} = I_D$ $sw_{22} = sw_{23} = Z_D$

The auto-zero capacitor $C_Z$ switch controls are designed as:

$sw_{26}=sw_{27}=Z$ $sw_{25}=I$

The reset switch control is:

$sw_{28}=RESET$

Figure 7:
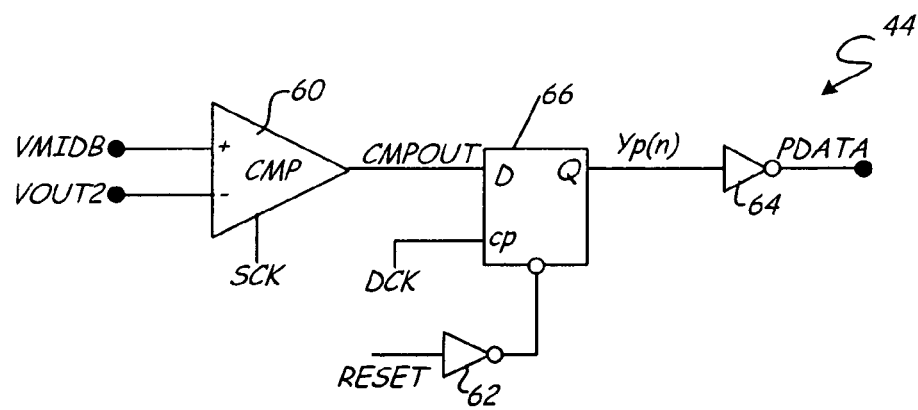
FIG. 7 is a schematic diagram of the quantizer of the CD modulator.

FIG. 7 shows a schematic diagram of quantizer 44, which includes comparator 60, inverters 62 and 64, and D flip-flop 66. The basic function of quantizer 44 is to convert the analog output of integrator 42 to a one-bit digital signal.

Two timing signals, SCK and DCK are required in the quantizer circuit. The waveforms of SCK and DCK are shown in FIG. 8. Timing signal SCK, with its negative pulse designed at the end of integration phase, provides active low trigger for comparator 60.

The positive input node of comparator 60 is connected to $V_{MID}$. The negative input node of comparator 60 is connected to the output of integrator 42. If the output voltage $V_{OUT2}$ of integrator 42 is lower than that of $V_{MID}$, then the comparator output CMPOUT is "1", otherwise it is "0".

D flip-flop 66 synchronizes the comparator output signal. D flip-flop 66, with DCK as clock input, creates the synchronized signal $Y_P(n)$, which is inverted by inverter 64. The resulting signal, PDATA, is sent to the digital filter within digital section 14. At the same time, its equivalent signal YBP serves for the modulator switch logic signal.

Figure 9:
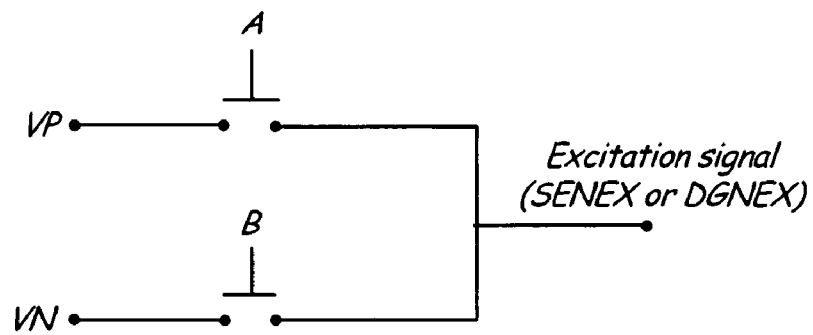
FIG. 9 is a schematic diagram of the excitation signal generator of the CD modulator.
Figure 10:
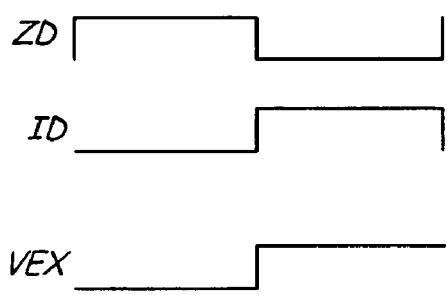
FIGS. 10A and 10B are waveforms of ZD, ID and VEX for positive excitation and negative excitation, respectively.
Figure 10:
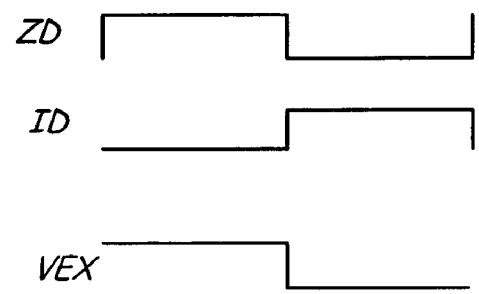

The general structure of excitation signal generator 46 is shown as FIG. 9, where A, B are the switches, $V_P=0.75\ V_{dda}$ and $V_N=0.25_{dda}$ are the voltage sources for generating excitation signals. The polarity of excitation signal is determined by the control signals of switches A and B. In Table 3, the switch control signals for generating a positive excitation signal or a negative excitation signal are listed in terms of the timing signals ZD and ID. The waveforms of the positive excitation and negative excitation signals are shown as FIGS. 10A and 10B.

TABLE 3

The control of excitation polarity

|  | A | B |
|---|---|---|
| Positive excitation | ID | ZD |
| Negative excitation | ZD | ID |

There are two excitation signal generators in the CD modulator control unit: the sensor excitation signal (SENEX) generator and the built-in-test excitation signal (DGNEX) generator. The requirements generating the SENEX signal are listed as follows: 1) if the quantizer output logic signal $Y_P(n)=1$, the polarity of SENEX signal is positive; 2) if the quantizer output logic signal $Y_P(n)=0$, the polarity signal is negative; and 3) SENEX signal is active only in normal operation mode, that is DMOD=0. The switch control logic for generating SENEX signal is shown in Table 4.

TABLE 4

Switch control signal for generating SENEX

| Quantizer Output | A | B |
|---|---|---|
| Y = 1 | $\overline{DMOD} \cdot ID$ | $\overline{DMOD} \cdot ZD$ |
| Y = 0 | $\overline{DMOD} \cdot ZD$ | $\overline{DMOD} \cdot ID$ |

The requirements for generating the DGNEX signal are listed as follows: 1) if the quantizer logic output $Y_P(n)=1$, then the polarity of DGNEX signal is positive; 2) if the quantizer logic output $Y_P(n)=0$, then the polarity of DGNEX signal is negative; and 3) DGNEX signal is active only in BIT-mode, that is DMOD-1. The switch control logic for generating DGNEX signal is shown in Table 5.

TABLE 5

Switch control signal for generating DGNEX

| Quantizer Output | A | B |
|---|---|---|
| Y = 1 | $DMOD \cdot ID$ | $DMOD \cdot ZD$ |
| Y = 0 | $DMOD \cdot ZD$ | $DMOD \cdot ID$ |

Figure 11:
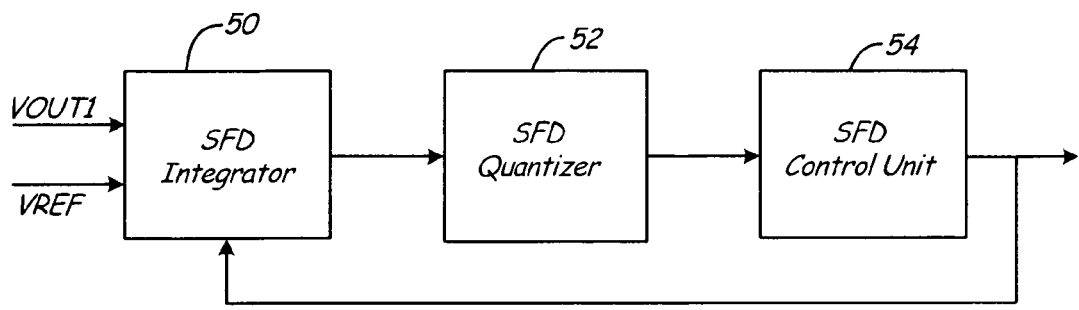
FIG. 11 is a functional block diagram of the sensor failure mode detection modulator of the CD modulator of FIG. 2.

SFD detector 32 is a secondary over-sampling AD modulator. The basic function of SFD detector 32 is to convert the capacitance ratio $C_R/C_{F1}$ into the PCMR signal, where $C_R$ is the reference capacitor and $C_{F1}$ is the feedback capacitor of first stage integrator 40. The simplified block diagram is as shown in FIG. 11. It includes three blocks, SFD-integrator 50, SFD-quantizer 52, and SFD-control-unit 54.

Figure 12:
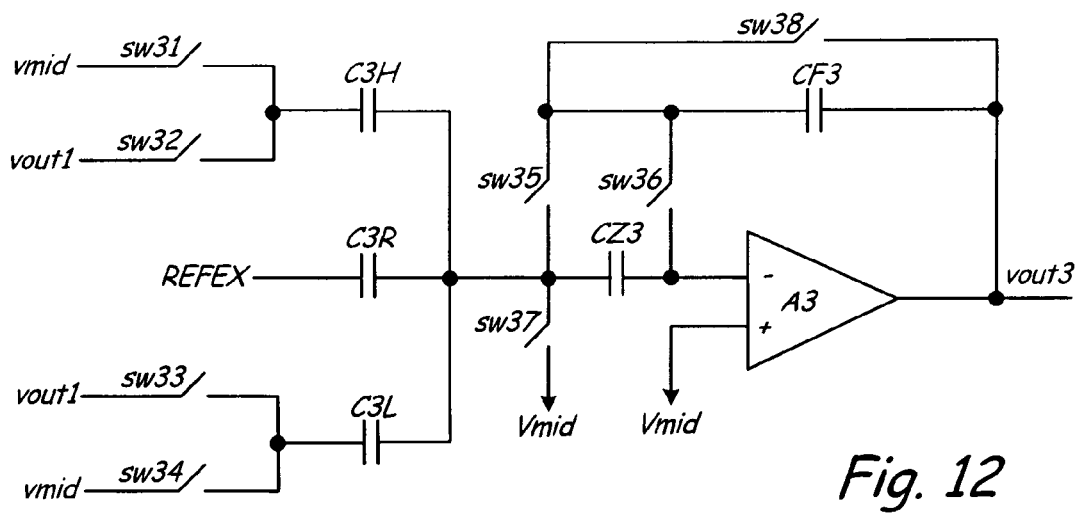
FIG. 12 is a schematic diagram of the integrator of the sensor failure mode detection modulator.

SFD detector 32 is active only if SFD=1, and is in sleep mode (zero power consumption) if SFD=0. Denoting U(n) and U(n−1) as the present and the previous output of integrator 40 ($V_{OUT1}$), the incremental of SFD-integrator 50 operation is specified as:

$\Delta V(n) = -\frac{1}{4}[U(n)-U(n-1)+\overline{Y_P(n)} \cdot Y_X(n) \cdot V_{EX} - \overline{Y_P(n)} \cdot \overline{Y_X(n)} \cdot V_{EX}]$ A simplified schematic of SFD-integrator 50 is shown as FIG. 12. It includes switches $SW_{31}$–$SW_{38}$, amplifier A3, feedback capacitor $C_{F3}$ and auto-zero capacitor $C_{Z3}$. In an example, $C_{F3}=20$ pF, $C_Z=10$ pF, $C_{3H}=C_{3L}=C_{3R}=5$ pF. The basic operation is as follows:

Switches $SW_{36}$ and $SW_{37}$, together with auto-zero capacitor $C_{Z3}$, provide an auto-zero path, while $SW_{35}$ provides an integration path. Switch $SW_{38}$ serves for integrator reset. Capacitor $C_{3H}$ serves for U(n) sampling. Capacitor $C_{3L}$ serves for U(n−1) sampling. Capacitor $C_{3R}$ provides $\Delta V_{REF}=V_P-V_N$. The excitation signal REFEX is generated by SFD-control-unit 54.

The control logic of switches $SW_{31}$–$SW_{38}$ are listed as follows:

$sw_{31}=sw_{33}=SFD \cdot [Y_P(n)+Z_D]$ $sw_{32}=sw_{34}=SFD \cdot \overline{Y_P(n)} \cdot I_D$ $sw_{36}=sw_{37}=SFD \cdot [Y_P(n)+Z]$ $sw_{35}=SFD \cdot \overline{Y_P(n)} \cdot I$ $sw_{38}=RESET$ SFD-quantizer 52 is similar as that of the main quantizer 44. It includes a comparator, an inverter and a D flip-flop. The positive input node of the comparator is connected to the output of the SFD-integrator 50. The negative input node of the comparator is connected to the reference voltage $V_{MID}$. The comparator trigger signal DSCK is designed as:

$DSCK=SFD \cdot \overline{Y_P(n)} \cdot SCK$

The pulse code modulation signal PCMR is:

$PCMR=SFD \cdot \overline{Y_P(n)} \cdot \overline{Y_X(n)} \cdot I$

The main function of SFD-control unit 54 is to generate excitation signal for the capacitor $C_{3R}$ in SFD-integrator 50. Using the same notation as described in main excitation control unit 46, the switch control signal for generating excitation signal, REFEX, is listed in Table 6.

TABLE 6

REFEX Switch Control Signals

| Quantizer Output | A | B |
|---|---|---|
| $Y_X = 1$ | $SFD \cdot \overline{Y_P} \cdot I_D$ | $SFD \cdot (Y_P + Z_D)$ |
| $Y_X = 0$ | $SFD \cdot (Y_P + Z_D)$ | $SFD \cdot \overline{Y_P} \cdot I_D$ |

Denoting $N_{P0}$ as the number of "0's" in $Y_P$, $N_{X0}$ as the number of "0's" in $Y_X$, and define the pulse density $D_{X0}$ as:

$$D_{X0} = \frac{N_{X0}}{N_{P0}}$$

The measurement relations of SFD detector 32 can be expressed as:

$$\frac{C_R}{C_{F1}} = 2 \cdot D_{X0} - 1$$

Use of SFD detector 32 in CD modulator 12 to monitor sensor failure has several advantages. First, the SFD function is disturbance free. In other words, when the SFD function is on-line, the monitoring process conducted by SFD detector 32 does not introduce any interruption or disturbance to the operations of CD modulator 12.

Second, the SFD function provides flexibility in the threshold values used to identify sensor failure modes. The threshold values used to identify when the PCMR signal identifies either an OS or an OF failure mode can be stored in digital section 14 and can be modified by microprocessor 18 based upon experience or based upon operator commands received through interface 20.

Third, reliability of the SFD function is high. The variable being monitored is the capacitance ratio of reference capacitor $C_R$ versus an on-chip capacitor $C_{F1}$.

Fourth, the SFD function is user selectable. When the SFD function is disabled, SFD detector 32 is in sleep mode, and does not consume current.

Fifth, the SFD function is provided using only low power, is a low cost addition, and requires only a small area of the integrated circuit chip in CD modulator 12. For example, when main modulator 30 is operating at 96 kHz, SFD detector 32 consumes only 80 microamps at a 4.35 volt supply. This is less than ⅙ of the current consumed by main modulator 30. The integrated circuit chip area of CD modulator 12 without SFD detector 32 is about 1.28 mm². The area of CD modulator 12 with SFD detector 32 is about 1.68 mm². Thus the area is only increased by about 0.40 mm² to provide the SFD function. Because of this small area, the unit cost of adding the SFD function to CD modulator 12 is also low.

Although the present invention has been described with reference to preferred embodiments, workers skilled in the art will recognize that changes may be made in form and detail without departing from the spirit and scope of the invention.

The invention claimed is:

1. A capacitance-to-digital (CD) modulator for converting a sensor capacitance $C_S$ and a reference capacitance $C_R$ to a pulse code modulated (PCM) signal, the CD modulator comprising:

a first stage sigma-delta integrator for selectively forming charge packets in $C_S$ and $C_R$ during a first phase, and integrating charge from $C_S$ and $C_R$ during a second phase to produce a first stage output $V_{OUT1}$, wherein the first stage sigma-delta integrator includes a feedback capacitor for having a capacitance $C_{F1}$;

a second stage sigma-delta integrator for sampling the first stage output $V_{OUT1}$, and integrating the sampled first stage output to produce a second stage output $V_{OUT2}$;

a quantizer for converting the second stage output $V_{OUT2}$ to the PCM signal; and a sensor failure mode detection (SFD) circuit for deriving from $V_{OUT1}$ an SFD signal that identifies failure modes of $C_S$ and $C_R$, wherein the SFD signal is representative of a capacitance ratio $C_R/C_{F1}$.

2. The CD modulator of claim 1 and further comprising:
a CD control unit for selectively providing an excitation signal to the sensor capacitance $C_S$ and reference capacitance $C_R$ as a function of the PCM signal.

3. The CD modulator of claim 2, wherein the first stage sigma-delta integrator comprises:
an integrator input node;
an amplifier having a first input, a second input and an output;
an auto-zero capacitor $C_{Z1}$ connected between the integrator input node and the first input of the amplifier; and
wherein the feedback capacitor having capacitance $C_{F1}$ is connected to the output of the amplifier.

4. The CD modulator of claim 1, wherein the SFD signal is pulse code modulated.

5. The CD modulator of claim 1, wherein the SFD circuit comprises:
an SFD integrator for sampling $V_{OUT1}$ and producing an output $V_{OUT3}$;
an SFD quantizer for converting $V_{OUT3}$ to the SFD signal; and
an SFD control unit for providing an SFD excitation signal to the SFD integrator as a function of the SFD signal.

6. The CD modulator of claim 1, wherein the SFD circuit comprises an over-sampling analog-to-digital converter for sampling $V_{OUT1}$.

7. The CD modulator of claim 6, wherein the SFD circuit is active when $C_R$ is connected to the first stage sigma-delta integrator.

8. A pressure transmitter comprising:
a sensor capacitance;
a reference capacitance;
a primary capacitance-to-digital (CD) modulator for producing a pulse code modulated signal PCMP representative of sensed pressure, the primary CD modulator comprising:
a first stage sigma-delta integrator for selectively forming charge packets as a function of sensor and reference capacitances, and integrating the charge packets to produce a first stage output $V_{OUT1}$;
a second stage sigma-delta integrator for sampling the first stage output $V_{OUT1}$, and integrating the sampled first stage output to produce a second stage output $V_{OUT2}$;
a quantizer for converting the second stage output $V_{OUT2}$ to the PCMP signal; and
a secondary modulator for sampling $V_{OUT1}$ and producing a pulse code modulated signal PCMR indicative of whether the sensor capacitance and the reference capacitance are in a failure mode, wherein the signal PCMR is representative of a capacitance ratio $C_R/C_{F1}$, where $C_R$ is the reference capacitance and $C_{F1}$ is capacitance of a feedback capacitor of the first stage sigma-delta integrator.

9. The pressure transmitter of claim 8, wherein the first stage sigma-delta integrator comprises:
an integrator input node;
an amplifier having a first input, a second input and an output;
an auto-zero capacitor connected between the common node and the first input of the amplifier; and
wherein the feedback capacitor which is connected to the output of the amplifier.

10. The pressure transmitter of claim 8, wherein the secondary modulator comprises:
an integrator for sampling $V_{OUT1}$ and producing an output $V_{OUT3}$;
a quantizer for converting $V_{OUT3}$ to the signal PCMR; and
a control unit for providing an excitation signal to the integrator as a function of the signal.

11. The pressure transmitter of claim 8, wherein the secondary modulator is active when the reference capacitance is connected to the first stage sigma-delta integrator.

12. The pressure transmitter of claim 8, and further comprising:
a microprocessor for determining whether a failure mode exists based upon the signal PCMR.

13. A capacitance-to-digital (CD) modulator for converting a sensor capacitance $C_S$ and a reference capacitance $C_R$ to a pulse code modulated (PCM) signal, the CD modulator comprising:
a first stage sigma-delta integrator for selectively forming charge packets in $C_S$ and $C_R$ during a first phase, and integrating charge from $C_S$ and $C_R$ during a second phase to produce a first stage output $V_{OUT1}$;
a second stage sigma-delta integrator for sampling the first stage output $V_{OUT1}$, and integrating the sampled first stage output to produce a second stage output $V_{OUT2}$;
a quantizer for converting the second stage output $V_{OUT2}$ to the PCM signal; and
a sensor failure mode detection (SFD) circuit for deriving from $V_{OUT1}$ an SFD signal that identifies failure modes of $C_S$ and $C_R$, wherein the SFD circuit comprises:
an SFD integrator for sampling $V_{OUT1}$ and producing an output $V_{OUT3}$;
an SFD quantizer for converting $V_{OUT3}$ to the SFD signal; and
an SFD control unit for providing an SFD excitation signal to the SFD integrator as a function of the SFD signal.

14. The CD modulator of claim 13 and further comprising:
a CD control unit for selectively providing an excitation signal to the sensor capacitance $C_S$ and reference capacitance $C_R$ as a function of the PCM signal.

15. The CD modulator of claim 14, wherein the first stage sigma-delta integrator comprises:
an integrator input node;
an amplifier having a first input, a second input and an output;
an auto-zero capacitor $C_{Z1}$ connected between the integrator input node and the first input of the amplifier; and
a feedback capacitor $C_{F1}$ connected to the output of the amplifier.

16. The CD modulator of claim 15, wherein the SFD signal is representative of a capacitance ratio $C_R/C_{F1}$.

17. The CD modulator of claim 16, wherein the SFD signal is pulse code modulated.

18. The CD modulator of claim 13, wherein the SFD circuit comprises an over-sampling analog-to-digital converter for sampling $V_{OUT1}$.

19. The CD modulator of claim 18, wherein the SFD circuit is active when $C_R$ is connected to the first stage sigma-delta integrator.

20. A capacitance-to-digital (CD) modulator for converting a sensor capacitance $C_S$ and a reference capacitance $C_R$ to a pulse code modulated (PCM) signal, the CD modulator comprising:
a first stage sigma-delta integrator for selectively forming charge packets in $C_S$ and $C_R$ during a first phase, and integrating charge from $C_S$ and $C_R$ during a second phase to produce a first stage output $V_{OUT1}$;
a second stage sigma-delta integrator for sampling the first stage output $V_{OUT1}$, and integrating the sampled first stage output to produce a second stage output $V_{OUT2}$;
a quantizer for converting the second stage output $V_{OUT2}$ to the PCM signal; and
a sensor failure mode detection (SFD) circuit for deriving from $V_{OUT1}$ an SFD signal that identifies failure modes of $C_S$ and $C_R$, wherein the SFD circuit comprises an over-sampling analog-to-digital converter for sampling $V_{OUT1}$, and wherein the SFD circuit is active when $C_R$ is connected to the first stage sigma-delta integrator.

21. The CD modulator of claim 20 and further comprising:
a CD control unit for selectively providing an excitation signal to the sensor capacitance $C_S$ and reference capacitance $C_R$ as a function of the PCM signal.

22. The CD modulator of claim 21, wherein the first stage sigma-delta integrator comprises:
an integrator input node;
an amplifier having a first input, a second input and an output;
an auto-zero capacitor $C_{Z1}$, connected between the integrator input node and the first input of the amplifier; and
a feedback capacitor $C_{F1}$ connected to the output of the amplifier.

23. The CD modulator of claim 22, wherein the SFD signal is representative of a capacitance ratio $C_R/C_{F1}$.

24. The CD modulator of claim 20, wherein the SFD signal is pulse code modulated.

25. A pressure transmitter comprising:
a sensor capacitance;
a reference capacitance;
a primary capacitance-to-digital (CD) modulator for producing a pulse code modulated signal PCMP representative of sensed pressure, the primary CD modulator comprising:
a first stage sigma-delta integrator for selectively forming charge packets as a function of sensor and reference capacitances, and integrating the charge packets to produce a first stage output $V_{OUT1}$;
a second stage sigma-delta integrator for sampling the first stage output $V_{OUT1}$, and integrating the sampled first stage output to produce a second stage output $V_{OUT2}$;
a quantizer for converting the second stage output $V_{OUT2}$ to the PCMP signal; and a secondary modulator for sampling $V_{OUT1}$ and producing a pulse code modulated signal PCMR indicative of whether the sensor capacitance and the reference capacitance are in a failure mode, wherein the secondary modulator comprises:
- an integrator for sampling $V_{OUT1}$ and producing an output $V_{OUT3}$;
- a quantizer for converting $V_{OUT3}$ to the signal PCMR; and
- a control unit for providing an excitation signal to the integrator as a function of the signal.

26. The pressure transmitter of claim 25, wherein the first stage sigma-delta integrator comprises:
- an integrator input node;
- an amplifier having a first input, a second input and an output;
- an auto-zero capacitor connected between the common node and the first input of the amplifier; and
- a feedback capacitor connected to the output of the amplifier.

27. The pressure transmitter of claim 25 wherein the secondary modulator is active when the reference capacitance is connected to the first stage sigma-delta integrator.

28. The pressure transmitter of claim 25 and further comprising:
- a microprocessor for determining whether a failure mode exists based upon the signal PCMR.

29. A pressure transmitter comprising:
- a sensor capacitance;
- a reference capacitance;
- a primary capacitance-to-digital (CD) modulator for producing a pulse code modulated signal PCMP representative of sensed pressure, the primary CD modulator comprising:
  - a first stage sigma-delta integrator for selectively forming charge packets as a function of sensor and reference capacitances, and integrating the charge packets to produce a first stage output $V_{OUT1}$;
  - a second stage sigma-delta integrator for sampling the first stage output $V_{OUT1}$, and integrating the sampled first stage output to produce a second stage output $V_{OUT2}$; and
  - a quantizer for converting the second stage output $V_{OUT2}$ to the PCMP signal; and
- a secondary modulator for sampling $V_{OUT1}$ and producing a pulse code modulated signal PCMR indicative of whether the sensor capacitance and the reference capacitance are in a failure mode, wherein the secondary modulator is active when the reference capacitance is connected to the first stage sigma-delta integrator.

30. The pressure transmitter of claim 29, wherein the first stage sigma-delta integrator comprises:
- an integrator input node;
- an amplifier having a first input, a second input and an output;
- an auto-zero capacitor connected between the common node and the first input of the amplifier; and
- a feedback capacitor connected to the output of the amplifier.

31. The pressure transmitter of claim 29 and further comprising:
- a microprocessor for determining whether a failure mode exists based upon the signal PCMR.

* * * * *

UNITED STATES PATENT AND TRADEMARK OFFICE
CERTIFICATE OF CORRECTION

| | |
|---|---|
| PATENT NO. | : 7,236,113 B1 |
| APPLICATION NO. | : 11/340363 |
| DATED | : June 26, 2007 |
| INVENTOR(S) | : Rongtai Wang |

It is certified that error appears in the above-identified patent and that said Letters Patent is hereby corrected as shown below:

Title Pg, Item (73) Assignee delete "Emerson Process Management, Eden Prairie, MN (US)", insert --Fisher-Rosemount Systems, Inc., Austin, TX (US)--

Column 6, Line 36 delete

"$sw_8 = sw_9 = \overline{DMOD} \bullet Y_P$"

insert

--$SW_8 = SW_9 = \overline{DMOD} \bullet \overline{Y_P}$--

Signed and Sealed this

Twenty-first Day of October, 2008

JON W. DUDAS
*Director of the United States Patent and Trademark Office*